United States Patent [19]

Collins et al.

[11] Patent Number: 5,300,460
[45] Date of Patent: Apr. 5, 1994

[54] UHF/VHF PLASMA FOR USE IN FORMING INTEGRATED CIRCUIT STRUCTURES ON SEMICONDUCTOR WAFERS

[75] Inventors: Kenneth S. Collins, Morgan Hill; Craig A. Roderick, San Jose; Chan-Lon Yang, Los Gatos; David N. K. Wang, Saratoga; Dan Maydan, Los Altos Hills, all of Calif.

[73] Assignee: Applied Materials, Inc., Santa Clara, Calif.

[21] Appl. No.: 32,744

[22] Filed: Mar. 16, 1993

Related U.S. Application Data

[63] Continuation of Ser. No. 973,199, Nov. 6, 1992, abandoned, which is a continuation of Ser. No. 902,757, Jun. 23, 1992, abandoned, which is a continuation of Ser. No. 560,530, Jul. 31, 1990, abandoned, which is a continuation-in-part of Ser. No. 416,750, Oct. 3, 1989, abandoned.

[51] Int. Cl.$^5$ .................. H01L 21/00; H01L 21/02; H01L 21/22; H01L 21/265
[52] U.S. Cl. .................. 437/225; 437/228; 427/534; 118/50.1; 118/620
[58] Field of Search .................. 437/225, 228; 427/38, 427/39; 118/50.1, 620

[56] References Cited

U.S. PATENT DOCUMENTS

| | | | |
|---|---|---|---|
| 4,382,100 | 5/1983 | Holland | 427/38 |
| 4,496,448 | 1/1985 | Tai et al. | 204/192.32 |
| 4,513,022 | 4/1985 | Jansen et al. | |
| 4,521,286 | 6/1985 | Horwitz | |
| 4,585,668 | 4/1986 | Asmussen et al. | |
| 4,726,879 | 2/1988 | Bondur et al. | |
| 4,795,529 | 1/1989 | Kawasaki et al. | |
| 4,824,546 | 4/1989 | Ohmi | |
| 4,863,549 | 9/1989 | Grünwald | |
| 4,872,947 | 10/1989 | Wang et al. | |
| 4,897,284 | 1/1990 | Arai et al. | 427/39 |
| 4,915,979 | 4/1990 | Ishida et al. | 427/39 |
| 4,989,542 | 2/1991 | Kamo | 427/39 |
| 4,996,079 | 2/1991 | Itoh | 427/38 |
| 5,064,522 | 11/1991 | Wellerdieck | |

FOREIGN PATENT DOCUMENTS

| | | |
|---|---|---|
| 0334638 | 3/1989 | European Pat. Off. |
| 0346131 | 6/1989 | European Pat. Off. |
| 0194326 | 8/1988 | Japan |
| 0148843 | 6/1990 | Japan |

OTHER PUBLICATIONS

Power Loss Mechanisms in Radio Frequency Dry Etching Systems; Van Den Hoek et al; Journal of Vac. Sci. & Tech (1987).
Bias ECR Device; Anelva Corp; Pat. Abstracts of Japan vol. 14, No. 412; Sep. 6, 1990.
"Positive-ion Bombardment of Substrates in RF Diode Glow Discharge Sputtering" J. W. Coburn et al.; J. Appl. Phys., vol. 43, No. 12; pp. 4965–4971; Dec. 1972.

Primary Examiner—Brian E. Hearn
Assistant Examiner—B. Everhart
Attorney, Agent, or Firm—Stephen R. Seccombe; Jeffrey G. Sheldon

[57] ABSTRACT

An improved method of fabricating integrated circuit structures on semiconductor wafers using a plasma-assisted process is disclosed wherein the plasma is generated by a VHF/UHF power source at a frequency ranging from about 50 to about 800 MHz. Low pressure plasma-assisted etching or deposition processes, i.e., processes may be carried out within a pressure range not exceeding about 500 milliTorr; with a ratio of anode to cathode area of from about 2:1 to about 20:1, and an electrode spacing of from about 5 cm. to about 30 cm. High pressure plasma-assisted etching or deposition processes, i.e., processes may be carried out with a pressure ranging from over 500 milliTorr up to 50 Torr or higher; with an anode to cathode electrode spacing of less than about 5 cm. By carrying out plasma-assisted processes using plasma operated within a range of from about 50 to about 800 MHz, the electrode sheath voltages are maintained sufficiently low, so as to avoid damage to structures on the wafer, yet sufficiently high to preferably permit initiation of the processes without the need for supplemental power sources. Operating in this frequency range may also result in reduction or elimination of microloading effects.

26 Claims, 4 Drawing Sheets

---

PROVIDING A CHAMBER AT A PRESSURE OF FROM ABOUT 2 TO ABOUT 500 MILLITORR CONTAINING AN ANODE AND A CATHODE, ON WHICH A SEMICONDUCTOR WAFER IS MOUNTED, WITH AN ELECTRODE SPACING OF 5 CM OR MORE

ETCHING A MATERIAL ON THE SEMICONDUCTOR WAFER USING A PLASMA ENERGIZED BY A POWER SOURCE OPERATED AT A FREQUENCY OF FROM ABOUT 50 MHz TO ABOUT 800 MHz AND A POWER DENSITY OF 10 TO 76 WATTS/IN$^2$

PROVIDING A CHAMBER AT A PRESSURE OF
FROM ABOUT 2 TO ABOUT 500 MILLITORR
CONTAINING AN ANODE AND A CATHODE, ON
WHICH A SEMICONDUCTOR WAFER IS MOUNTED,
WITH AN ELECTRODE SPACING OF 5 CM OR MORE

ETCHING A MATERIAL ON THE SEMICONDUCTOR
WAFER USING A PLASMA ENERGIZED BY A
POWER SOURCE OPERATED AT A FREQUENCY
OF FROM ABOUT 50 MHz TO ABOUT 800 MHz
AND A POWER DENSITY OF 10 TO 76 WATTS/IN$^2$

FIGURE 1

PROVIDING A CHAMBER AT A PRESSURE OF
FROM ABOVE 500 MILLITORR TO ABOUT 50 TORR
CONTAINING AN ANODE AND A CATHODE, ON
WHICH A SEMICONDUCTOR WAFER IS MOUNTED,
WITH AN ELECTRODE SPACING LESS THAN 5 CM

ETCHING A MATERIAL ON THE SEMICONDUCTOR
WAFER USING A PLASMA ENERGIZED BY A
POWER SOURCE OPERATED AT A FREQUENCY
OF FROM ABOUT 50 MHz TO ABOUT 800 MHz
AND A POWER DENSITY OF 15 TO 76 WATTS/IN$^2$

FIGURE 2

PROVIDING A CHAMBER AT A PRESSURE OF
FROM ABOUT 2 TO ABOUT 500 MILLITORR
CONTAINING AN ANODE AND A CATHODE, ON
WHICH A SEMICONDUCTOR WAFER IS MOUNTED,
WITH AN ELECTRODE SPACING OF 5 CM OR MORE

DEPOSITING A MATERIAL ON THE SEMICONDUCTOR
WAFER USING A PLASMA ENERGIZED BY A
POWER SOURCE OPERATED AT A FREQUENCY
OF FROM ABOUT 50 MHz TO ABOUT 800 MHz
AND A POWER DENSITY OF 10 TO 76 WATTS/IN$^2$

FIGURE 3

UHF/VHF PLASMA FOR USE IN FORMING INTEGRATED CIRCUIT STRUCTURES ON SEMICONDUCTOR WAFERS

This application is a continuation of application Ser. No. 07/973,199, filed Nov. 6, 1992, now abandoned, which is a continuation of application Ser. No. 07/902,757, filed Jun. 23, 1992, now abandoned, which is a continuation of application Ser. No. 07/560,530, filed Jul. 31, 1990, now abandoned, which is a continuation-in-part of application Ser. No. 07/416,750, filed Oct. 3, 1989, now abandoned.

BACKGROUND OF THE INVENTION

1. Field of the Invention

This invention relates to the processing of semiconductor wafers to form integrated circuit structures thereon. More particularly, this invention relates to the use of a VHF/UHF plasma in the processing of semiconductor wafers.

2. Description of the Related Art

In the processing of semiconductor wafers to form integrated circuit structures thereon, plasma-assisted processes are often utilized either in deposition or etching process steps. In such processes, e.g., reactive ion etching (RIE), plasma etching, CVD facet, or conformal isotropic CVD, radio frequency power from a generator or power source is generally applied to electrodes within a vacuum processing chamber via a matching network of some kind which will maximize the power transfer from the generator or power source to the plasma. When an electric field of sufficient magnitude is established between electrodes in the vacuum chamber, the field accelerates electrons present in the gas which undergo collisions with gas molecules. Very little energy can be transferred through elastic processes, because of the large mass difference between electrons and atoms or molecules, so the electron gains energy from the field and eventually may collide inelastically with a gas molecule, exciting or ionizing it. Ionization can liberate additional electrons, which are, in turn, accelerated by the field. The process avalanches, causing gas breakdown, resulting in a steady state plasma when ionization and recombination processes are balanced. Highly reactive ions and radical species are produced which are used to etch or deposit materials on semiconductor wafers.

The power sources used for such prior art generation of plasmas conventionally utilized electromagnetic radiation at low frequencies ranging from about 10–400 kHz, at high frequencies ranging from about 13 to about 40 MHz (typically at 13.56 MHz), and at microwave frequencies ranging from about 900 MHz up to 2.5 GHz.

At low frequencies of 10–400 kHz, both ions and electrons can be accelerated by the oscillating electric field, as well as any steady state electric field or bias developed in the plasma, resulting in the risk of potential damage to sensitive devices being fabricated on the wafer. At higher frequencies of 13–40 MHz, the so-called high frequency range, steady state electrode sheath voltages may be developed ranging from several hundred to over 1000 volts. This creates a problem since device damage is a concern at voltages exceeding about 200 volts, depending upon the device structure, material, and other factors.

The problem of high sheath voltage has been ameliorated by the use of microwave power sources to excite the plasma, i.e., power sources at a frequency range of from about 900 to about 2.5 gHz. Such techniques produce a plasma at low particle energies, i.e., 10–30 ev. However, the use of microwave frequencies can result in loss of anisotropy (vertical nature) of the etch, apparently due to the lowering of the sheath voltage; and can slow the etch or deposition rate down, apparently due to lowering of the particle energy level. In fact, in some cases the threshold energy level for certain processes, e.g., reactive ion etching of $SiO_2$, cannot be reached using only microwave energy to power the plasma.

Because of such shortcomings in the use of a purely microwave energy source, microwave energy has been used in combination with another power source at high frequency, e.g. 13.56 MHz, to raise the sheath voltage at the wafer sufficiently to achieve the desired anisotropy in the etch. Microwave ECR sources use a microwave source and a magnetic field such that the ECR condition is met, that is, the radian frequency of the microwave source $w = |B|e/m$ where $|B|$ is the magnetic field magnitude and e and m are electron charge and mass respectively. This produces a high density, low energy plasma at low pressures. A divergent magnetic field can be used to extract ions and accelerate them to higher energies, and/or a high frequency bias may be applied to the wafer to increase ion energy.

However, such usage and coordination of multiple power source systems further complicates the apparatus used in carrying out such etching and/or deposition processes. Furthermore, the use of an ECR system necessitates the use of lower operating pressures ranging, for example, from 0.1 to several milliTorr. This, in turn, results in a reduction in the maximum flow rate of etching or deposition gases through the reaction chamber unless a very large vacuum pump is used.

It would, therefore, be desirable to conduct plasma-assisted processes using a power source wherein sheath voltages could be developed low enough to avoid risk of damage to devices on the wafer, yet high enough to achieve desired anisotropy, and at reaction rates comparable to prior art processes.

SUMMARY OF THE INVENTION

It is, therefore, an object of the invention to provide plasma-assisted processing for the production of integrated circuit devices on semiconductor wafers using a power source having a frequency range of from about 50 MHz up to about 800 MHz.

It is another object of the invention to provide a plasma-assisted RIE process for etching materials used in the fabrication of integrated circuit devices on semiconductor wafers which comprises using a power source having a frequency range of from about 50 MHz up to about 800 MHz and maintained at a power density level ranging from about 10 to about 76 watts/inc of wafer area in a vacuum chamber at a pressure within a range of from about 2 to about 500 milliTorr.

It is yet another object of the invention to provide a plasma-assisted RIE process for etching silicon oxide on semiconductor wafers which comprises using a power source having a frequency range of from about 100 MHz up to about 250 MHz and maintained at a power density level ranging from about 30 to about 76 watts/$inch^2$ of wafer area in a vacuum chamber at a pressure within a range of from about 2 to about 500 milliTorr, while flowing one or more etching gases and an optional inert gas through the chamber, with an effective area ratio of anode to cathode of at least about 2:1 and an electrode spacing of 5 cm. or more, to provide an anisotropic etch with an etch rate of from about 0.3 to 0.75 microns/minute.

It is still another object of the invention to provide a plasma-assisted RIE process for anisotropically etching silicon oxide on semiconductor wafers which comprises using a power source having a frequency range of from about 100 MHz up to about 250 MHz and maintained at a power density level ranging from about 45 to about 56 watts/inch$^2$ of wafer area in a vacuum chamber at a pressure within a range of from about 20 to about 200 milliTorr, while flowing a source of fluorine, an optional source of hydrogen, a source of carbon, and an optional inert gas through the chamber, with an effective area ratio of anode to cathode of from about 2:1 to about 20:1, and an electrode spacing of from about 5 cm. to about 30 cm., to provide an anisotropic etch with an etch rate of from about 0.3 to about 0.75 microns per minute.

It is a further object of the invention to provide a plasma-assisted RIE process for selectively anisotropically etching silicon oxide on semiconductor wafers, with respect to polysilicon or photoresist, which comprises using a power source having a frequency range of from about 100 MHz up to about 250 MHz and maintained at a power density level ranging from about 45 to about 56 watts/inch$^2$ of wafer area in a vacuum chamber at a pressure within a range of from about 20 to about 200 milliTorr, while flowing a source of fluorine, an optional source of hydrogen, a source of carbon, and an optional inert gas through the chamber, wherein the atomic ratio of carbon to fluorine ranges from about 0.1:1 to about 2:1 and the atomic ratio of hydrogen (when present) to fluorine ranges from about 0.1:1 to about 0.5:1, with an effective area ratio of anode to cathode of from about 2:1 to about 20:1, and an electrode spacing of from about 5 cm. to about 30 cm., to obtain a ratio of silicon oxide etch (thickness) rate to polysilicon or photoresist etch (thickness) rate of from about 2:1 to over 30:1, with an etch rate of from about 0.3 to about 0.75 microns per minute.

It is yet a further object of the invention to provide a plasma-assisted RIE process for etching polysilicon and/or aluminum on semiconductor wafers which comprises using a power source having a frequency range of from about 100 MHz up to about 800 MHz and maintained at a power density level ranging from about 10 to about 76 watts/inch$^2$ of wafer area in a vacuum chamber at a pressure within a range of from about 2 to about 500 milliTorr, while flowing one or more etching gases and an optional inert gas through the chamber, with a ratio of anode to cathode area of at least about 2:1 and an electrode spacing of 5 cm. or more, to provide an
anisotropic etch with an etch rate of from about 0.2 to about 1.0 microns/minute.

It is still a further object of the invention to provide a plasma-assisted RIE process for anisotropically etching polysilicon and/or aluminum on semiconductor wafers which comprises using a power source having a frequency range of from about 150 MHz up to about 600 MHz and maintained at a power density level ranging from about 20 to about 40 watts/inch$^2$ of wafer area in a vacuum chamber at a pressure within a range of from about 20 to about 200 milliTorr, while flowing a source of chlorine and an optional inert gas through the chamber, with a ratio of anode to cathode area of from about 2:1 to about 20:1, and an electrode spacing of from about 5 cm. to about 30 cm., to provide an anisotropic etch with an etch rate of from about 0.5 to about 0.7 microns/minute.

It is another object of the invention to provide a plasma-assisted etching process for etching materials used in the fabrication of integrated circuit devices on semiconductor wafers which comprises using a power source having a frequency range of from about 50 MHz up to about 800 MHz and maintained at a power density level ranging from about 15 to about 76 watts/inct of wafer area in a vacuum chamber at a pressure within a range of from over 500 milliTorr to about 50 Torr.

It is yet another object of the invention to provide a plasma-assisted etching process for etching silicon oxide on semiconductor wafers which comprises using a power source having a frequency range of from about 100 MHz up to about 200 MHz and maintained at a power density level ranging from about 30 to about 50 watts/inch$^2$ of wafer area in a vacuum chamber at a pressure within a range of from about 1 Torr to about 20 Torr, while flowing a source of fluorine, a source of carbon, an optional source of hydrogen, and an optional inert gas through the chamber, with an anode to cathode electrode spacing of less than about 5 cm., to provide an etch rate of from about 0.2 to about 1.0 microns/minute.

It is still another object of the invention to provide a plasma-assisted etching process for selectively etching silicon oxide on semiconductor wafers, with respect to the etching of polysilicon or photoresist, which comprises using a power source having a frequency range of from about 100 MHz up to about 200 MHz and maintained at a power density level ranging from about 30 to about 50 watts/inch$^2$ of wafer area in a vacuum chamber at a pressure within a range of from about 1 Torr to about 20 Torr, while flowing a source of fluorine, a source of carbon, an optional source of hydrogen, and an optional inert gas through the chamber, wherein the atomic ratio of carbon to fluorine ranges from about 0.1:1 to about 2:1 and the atomic ratio of hydrogen (when present) to fluorine ranges from about 0.1:1 to about 0.5:1, with a cathode to anode electrode spacing of less than about 5 cm., to obtain a ratio of silicon oxide etch (thickness) rate to polysilicon or photoresist etch (thickness) rate of from about 2:1 to over 30:1, with an etch rate of from about 0.2 to about 1.0 microns per minute.

It is still a further object of the invention to provide a plasma-assisted etching process for etching polysilicon and/or aluminum on semiconductor wafers which comprises using a power source having a frequency range of from about 100 MHz up to about 200 MHz and maintained at a power density level ranging from about 20 to about 40 watts/inch$^2$ of wafer area in a vacuum chamber at a pressure within a range of from about 1 Torr to about 20 Torr, while flowing a source of chlorine and an optional inert gas through the chamber, with an anode to cathode electrode spacing of less than about 5 cm., to provide an etch rate of from about 0.2 to 1 about microns/minute.

It is another object of the invention to provide a plasma-assisted CVD facet deposition process for depositing materials used in the fabrication of integrated circuit devices on semiconductor wafers which comprises using a power source having a frequency range of from about 50 MHz up to about 800 MHz and maintained at a power density level ranging from about 10 to about 76 watts/inc of wafer area in a vacuum chamber at a pressure within a range of from about 2 to about 500 milliTorr.

It is yet another object of the invention to provide a plasma-assisted CVD facet deposition process for depositing silicon oxide on semiconductor wafers which comprises using a power source having a frequency range of from about 100 MHz up to about 250 MHz and maintained at a power density level ranging from about 10 to about 76 watts/incl of wafer area in a vacuum chamber at a pressure within a range of from about 2 to about 500 milliTorr, while flowing one or more sources of silicon, one or more sources of oxygen, and an optional inert gas through the chamber, with a ratio of anode to cathode area of at least about 2:1 and an electrode spacing of 5 cm. or more, to provide a deposition rate of from about 0.1 to about 1.5 microns/minute.

It is still another object of the invention to provide a plasma-assisted CVD facet deposition process for depositing silicon oxide on semiconductor wafers which comprises using a power source having a frequency range of from about 100 MHz up to about 250 MHz and maintained at a power density level ranging from about 45 to about 56 watts/inch$^2$ of wafer area in a vacuum chamber at a pressure within a range of from about 20 to about 200 milliTorr, while flowing one or more sources of silicon, one or more sources of oxygen, and an optional inert gas, through the chamber, with a ration of anode to cathode area of from about 2:1 to about 20:1, and an electrode spacing of from about 5 cm. to about 30 cm, to provide a deposition rate of from about 0.4 to about 1.0 microns/minute.

It is yet a further object of the invention to provide a plasma-assisted CVD facet deposition process for depositing silicon nitride on semiconductor wafers which comprises using a power source having a frequency range of from about 100 MHz up to about 250 MHz and maintained at a power density level ranging from about 10 to about 76 watts/inch$^2$ of wafer area in a vacuum chamber at a pressure within a range of from about 2 to about 500 milliTorr, while flowing one or more sources of silicon, one or more sources of nitrogen, an optional source of hydrogen, and an optional inert gas, through the chamber, with a ratio of anode to cathode area of at least about 2:i and an electrode spacing of 5 cm. or more, to provide a deposition rate of from about 0.1 to about 1.5 microns/minute.

It is still a further object of the invention to provide a plasma-assisted CVD facet deposition process for depositing silicon nitride on semiconductor wafers which comprises using a power source having a frequency range of from about 100 MHz up to about 250 MHz and maintained at a power density level ranging from about 45 to about 56 watts/inch$^2$ of wafer area in a vacuum chamber at a pressure within a range of from about 20 to about 200 milliTorr, while flowing one or more sources of silicon, one or more sources of nitrogen, an optional source of hydrogen, and an optional inert gas, through the chamber, with a ratio of anode to cathode area of from about 2:1 to about 20:1 , and an electrode spacing of from about 5 cm. to about 30 cm, to provide a deposition rate of from about 0.4 to about 1.0 microns/minute.

It is another object of the invention to provide a plasma-assisted CVD conformal isotropic deposition process for depositing materials used in the fabrication of integrated circuit devices on semiconductor wafers which comprises using a power source having a frequency range of from about 50 MHz up to about 800 MHz and maintained at a power density level ranging from about 10 to about 38 watts/inch$^2$ of wafer area in a vacuum chamber at a pressure within a range of from over 500 milliTorr to about 50 Torr.

It is yet another object of the invention to provide a plasma-assisted CVD conformal isotropic deposition process for depositing silicon oxide on semiconductor wafers which comprises using a power source having a frequency range of from about 150 MHz up to about 800 MHz and maintained at a power density level ranging from about 10 to about 38 watts/inch$^2$ of wafer area in a vacuum chamber at a pressure within a range of over 500 milliTorr to about 50 Torr while flowing one or more sources of silicon, one or more sources of oxygen, and an optional inert gas through the chamber, with an anode to cathode electrode spacing of less than about 5 cm, to provide a deposition rate of from about 0.5 to about 1.0 microns/minute.

It is still another object of the invention to provide a plasma-assisted CVD conformal isotropic deposition process for depositing silicon oxide on semiconductor wafers which comprises using a power source having a frequency range of from about 150 MHz up to about 800 MHz and maintained at a power density level ranging from about lo to about 38 watts/inch$^2$ of wafer area in a vacuum chamber at a pressure within a range of from about 1 Torr to about 20 Torr, while flowing one or more sources of silicon, one or more sources of oxygen, and an optional inert gas, through the chamber, with an anode to cathode electrode spacing of less than about 5 cm, to provide a deposition rate of from about 0.5 to about 1.0 microns/minute.

It is yet a further object of the invention to provide a plasma-assisted CVD conformal isotropic deposition process for depositing silicon nitride on semiconductor wafers which comprises using a power source having a frequency range of from about 150 MHz up to about 800 MHz and maintained at a power density level ranging from about 10 to about 38 watts/inch$^2$ of wafer area in a vacuum chamber at a pressure within a range of from over 500 milliTorr to about 50 Torr, while flowing one or more sources of silicon, one or more sources of nitrogen, an optional source of hydrogen, and an optional inert gas, through the chamber, with an anode to cathode electrode spacing of less than about 5 cm, to provide a deposition rate of from about 0.5 to about 1.0 microns/minute.

It is still a further object of the invention to provide a plasma-assisted CVD conformal isotropic deposition process for depositing silicon nitride on semiconductor wafers which comprises using a power source having a frequency range of from about 150 MHz up to about 800 MHz and maintained at a power density level ranging from about 10 to about 38 watts/inch$^2$ of wafer area in a vacuum chamber at a pressure within a range of from about 1 Torr to about 20 Torr, while flowing one or more sources of silicon, one or more sources of nitrogen, an optional source of hydrogen, and an optional inert gas, through the chamber, with an anode to cathode electrode spacing of less than about 5 cm, to provide a deposition rate of from about 0.5 to about 1.0 microns/minute.

BRIEF DESCRIPTION OF THE DRAWINGS

FIG. 1 is a flow sheet illustrating RIE low pressure etching using the plasma-assisted process of the invention.

FIG. 2 is a flow sheet illustrating high pressure etching using the plasma-assisted process of the invention.

FIG. 3 is a flow sheet illustrating low pressure CVD (facet) deposition using the plasma-assisted process of the invention.

DETAILED DESCRIPTION OF THE INVENTION

Figure 4:
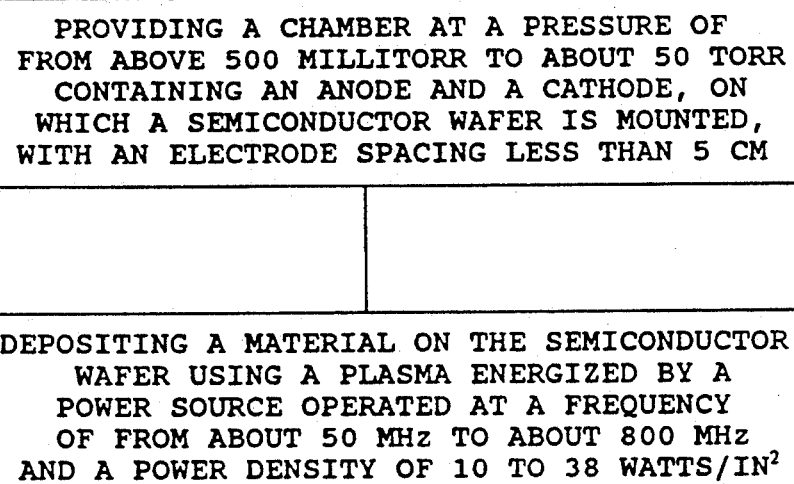
FIG. 4 is a flow sheet illustrating high pressure CVD conformal isotropic deposition using the plasma-assisted process of the invention.

The invention provides an improved method of fabricating integrated circuit structures on a semiconductor wafer mounted on a cathode and spaced from an anode in a vacuum chamber using a plasma-assisted process wherein the plasma is generated by a power source coupled to the cathode and anode in the vacuum chamber and operated at a frequency ranging from about 50 to about 800 MHz, which may be termed a VHF/UHF power source.

Preferably the power source generates power within a frequency range of from about 50 to about 500 MHz for low pressure plasma-assisted processes, i.e., processes carried out in a vacuum chamber maintained within a pressure range not exceeding about 500 milliTorr; with a ratio of anode to cathode area of from about 2:1 to about 20:1, and an electrode spacing of from about 5 cm. to about 30 cm.

The power source preferably generates power within a frequency range of from about 100 MHz to about 800 MHz for high pressure plasma-assisted processes, i.e., processes carried out in a vacuum chamber maintained at a pressure ranging from over 500 milliTorr up to 50 Torr or higher; with an anode to cathode electrode spacing of less than about 5 cm.

By carrying out plasma-assisted processes wherein the plasma is generated by a power source at a frequency within a range of from about 50 to about 800 MHz, the sheath voltages are maintained sufficiently low, so as to avoid damage to structures on the wafer, yet sufficiently high to preferably permit initiation of the processes without the need for supplemental power sources. Furthermore, the operation of a plasma within this frequency range results in a satisfactory rate of deposition and/or etch due to the decrease in ion energy and increase in ion flux density due to the respective decrease in the rf voltage component of the plasma and current increase due to the drop in plasma impedance at these frequencies. In addition, the establishment and powering of a plasma within this frequency range may result in reduction or elimination of microloading effects, e.g., the same etch rate may be maintained regardless of opening size.

The term "sheath", as used herein, denotes an electron deficient region developed at each electrode in the plasma. The term "sheath voltage" used herein means the voltage developed across the particular electron deficient region, i.e., the particular sheath, between the plasma and the electrode (cathode or anode).

The use of a plasma energized by a power source operated at a frequency ranging from about 50 MHz to about 800 MHz, in etching and/or deposition processes carried out in accordance with the invention, may be in combination with the use of auxiliary magnets arranged around the exterior of the chamber for magnetic enhancement. The plasma may be coupled to more than one power source, including a power source which may be operated outside of the frequency range of from about 50 MHz to about 800 MHz.

The invention may be used in reactive ion etching (RIE) at low pressures, i.e., 500 milliTorr and lower; in plasma etching at higher pressures, i.e., pressures above 500 millitorr; in chemical vapor deposition (CVD) facet processes at low pressure, i.e., 500 milliTorr and lower; and in conformal isotropic CVD processes at higher pressures, i.e., pressures above 500 milliTorr.

The process of the invention may be used in any conventional vacuum etching or deposition apparatus such as the apparatus disclosed in parent application Ser. No. 07/416,750, cross-reference to which is hereby made. However, it is important to the practice of the process of the invention that the power source, operating in the frequency range of from about 50 MHz to about 800 MHz in accordance with the invention, be properly coupled to the vacuum chamber. A network for properly matching the power source and coupling this power to the plasma within the vacuum chamber within this frequency range is disclosed and claimed in U.S. patent appl. Ser. No. 07/559,947 entitled "VHF/UHF REACTOR SYSTEM", filed on even date and assigned to the assignee of this invention; cross-reference to which is hereby made.

A. REACTIVE ION ETCHING

In accordance with the invention, materials, such as silicon oxide, polysilicon, and aluminum may be removed by a reactive ion etch (RIE) process using a plasma coupled to a power source operating within a frequency range of 50 MHz to 800 MHz, preferably within a frequency range of 50 MHz to 600 MHz at a pressure not exceeding about 500 milliTorr.

The ratio of total effective anode area to total effective cathode area in an RIE process carried out in accordance with the invention (with the wafer mounted on the cathode) will preferably range from about 2:1 anode area to cathode area up to about 20:1 with the average anode to cathode electrode spacing ranging from about 5 cm to about 30 cm. The "effective area" of the anode or cathode, as used herein, may be defined as the area of the electrode coupled to the plasma.

When a silicon oxide, such as, $SiO_2$, is to be removed, the frequency of the plasma power source will preferably be maintained within a range of from about 100 to about 250 MHz, with a typical frequency for the plasma power source maintained at from about 150 MHz to about 200 MHz. Higher frequencies can be used, up to about 800 MHz, but the etch rate and the anisotropy of the etch may be lowered thereby below acceptable limits.

The pressure used for RIE silicon oxide etching in the practice of the invention will range from about 2 milliTorr up to about 500 milliTorr, and will preferably range from about 20 to about 200 milliTorr, with a typical pressure being about 50 milliTorr.

The power density of the plasma used for etching silicon oxide in accordance with the invention (in watts/inch$^2$ of wafer area) will range from about 30 to about 76 watts/inch$^2$, e.g., from about 600–1500 watts for a typical 5" diameter wafer; preferably the power density may range from about 45 to about 56 watts/inch$^2$.

Various etching chemistries may be used in the practice of the RIE process of the invention for the removal of silicon oxide which will include one or more fluorine-containing gases, one or more carbon-containing gases, and optionally one or more hydrogen containing gases. Typical gases and mixtures of gases may include $CF_4$, $C_2F_6$, $C_4F_6$, $C_4F_8$, $CHF_3$, $CH_3F$ and $CHF_3$, $CH_3F$ and $CF_4$, $CHF_3$ and $CF_4$, $CF_4$ and $CH_4$, $C_2F_6$ and $CHF_3$, $C_4F_8$ and $CHF_3$, $NF_3$ and $CH_4$, $SF_6$ and $CH_4$, $CF_4$ and $H_2$, and combinations of such gases or mixtures of gases. An optional oxygen source may be combined with any of the above mixtures to control selectivity of the etch, as is well known to those skilled in the art. An inert flow gas, such as Argon, may be optionally used with any combination of etching gases to improve the anisotropy of the etch. Flows of each of the gases used for a typical 10–15 liter etching chamber may range from about 1 to about 300 sccm, depending upon the vacuum pump size used for the desired pressure range.

RIE removal of silicon oxide, using the process of the invention, results in an oxide removal rate ranging from about 0.3 to 0.75 microns/minute for an oxide grown thermally under wet oxide conditions (grown in steam). The etch is highly anisotropic in nature, with no discernible damage to the integrated circuit structures remaining on the wafer.

When it is desired to provide a silicon oxide etch which is selective to silicon oxide, with respect to polysilicon or photoresist, the atomic ratio of carbon to fluorine should range from about 0.1:1 to about 2:1; and the atomic ratio of hydrogen (when it is present in one of the gases) to fluorine should range from about 0.1:1 to about 0.5:1.

Aluminum and polysilicon may also be removed by an RIE process carried out in accordance with the invention using a power source operated at a frequency of from about 100 MHz to about 800 MHz, preferably from about 150 MHz to about 600 MHz.

The pressure used for the RIE removal of aluminum and/or polysilicon may be the same as that used for the RIE removal of oxide, i.e., a low pressure ranging from about 2 milliTorr to about 500 milliTorr and preferably ranging from about 20 milliTorr to about 200 milliTorr.

The RIE removal of aluminum and/or polysilicon, in accordance with the process of the invention, is carried out using a plasma power density ranging from about 10 to about 76 watts/in$^2$ of wafer area, e.g., from about 200–1500 watts for a 5" diameter wafer; and preferably a power density ranging from about 20 to about 40 watts/inch$^2$.

Typical RIE chemistries useful in the removal of aluminum and/or polysilicon may be employed in the practice of the process of the invention, such as a mixture of a chlorine-containing gas with an inert gas; e.g., a mixture of $Cl_2$ and Ar, or a mixture of $BCl_3$ and Ar. Typical flow rates of such gases for a 10–15 liter etch chamber may also range from about 10 to about 100 sccm for either the chlorine-containing gas or the inert gas, such as argon.

Etch removal rates for an aluminum and/or polysilicon RIE process carried out in accordance with the invention may range from about 0.2 to about 1.0 microns/minute, preferably ranging from about 0.5 to about 0.7 microns/minute. The etch is highly anisotropic in nature, with no discernible damage to the remaining integrated circuit structures on the wafer.

Single crystal silicon may also be removed using the RIE process of the invention by varying the chemistry used in etching silicon oxide, e.g., using a source of fluorine, and optional sources of carbon and oxygen.

B. Plasma-assisted High Pressure Etching

The etch removal of oxides of silicon, as well as aluminum and/or polysilicon, may also be carried out using high pressures, i.e., pressures over 500 milliTorr up to 50 Torr or higher. When such a high pressure plasma-assisted etch process is used in accordance with the invention, for removal of materials such as aluminum and/or polysilicon, the frequency of the power source used to energize the plasma will range from about 50 MHz to about 800 MHz, preferably from about 100 MHz to about 200 MHz; and the pressure will range from over 500 milliTorr to about 50 Torr or higher, preferably from about 1 Torr to about 20 Torr.

The power density will range from about 15 to about 76 watts/inch$^2$ of wafer area, preferably from about 30 to about 50 watts/inch$^2$. The anode to cathode electrode spacing will range from about 0.2 cm up to about 5 cm. so that plasma completely fills the volume between the electrodes.

Etching chemistries used in the practice of the high pressure plasma-assisted etching process of the invention for the removal of silicon oxide include one or more fluorine-containing gases, one or more carbon-containing gases, and optionally one or more hydrogen containing gases. Typical gases and mixtures of gases may include $CF_4$, $C_2F_6$, $C_4F_8$, $CHF_3$, $CH_3F$ and $CHF_3$, $CH_3F$ and $CF_4$, $CHF_3$ and $CF_4$, $CF_4$ and $CH_4$, $C_2F_6$ and $CHF_3$, $C_4F_8$ and $CHF_3$, $NF_3$ and $CH_4$, $SF_6$ and $CH_4$, $CF_4$ and $H_2$, and combinations of such gases or mixtures of gases. An optional oxygen source may be combined with any of the above mixtures to control selectivity of the etch, as is well known to those skilled in the art. An inert flow gas, such as Argon, may be optionally used with any combination of etching gases, if desired, to control the profile of the etch. Flows of each of the gases used for a typical 10–15 liter etching chamber may range from about 1 to about 300 sccm, depending upon the vacuum pump size used for the desired pressure range.

Etch rates of such high pressure plasma-assisted etches, which are carried out in accordance with the invention, will range from about 0.2 to about 1.0 microns/minute.

The etch chemistries useful in the removal of aluminum and/or polysilicon, in the practice of the process of the invention, are the same as used in the low pressure RIE process, i.e., a mixture of a chlorine-containing gas with an inert gas; e.g., a mixture of $Cl_2$ and Ar, or a mixture of $BCl_3$ and Ar. Typical flow rates of such gases for a 10–15 liter 10 etch chamber may also range from about 10 to about 100 soom for either the chlorine-containing gas or the inert gas, such as argon. Etch removal rates for aluminum and/or polysilicon, using such chemistries, may range from about 0.2 to about 1.0 microns/minute.

Single crystal silicon may also be removed using the high pressure etching process of the invention by varying the chemistry used in etching silicon oxide, e.g., using a source of fluorine, and optional sources of carbon and oxygen.

C. CVD Low Pressure (Facet) Deposition

The improved method of fabricating integrated circuit structures using a plasma-assisted process, wherein the plasma is generated by a power source at a frequency ranging from about 50 to about 800 MHz, may also be used for plasma-assisted deposition processes, such as a low pressure CVD process.

In such a process, sometimes known as a CVD facet process, etching of the materials (e.g., oxide or nitride) deposited on the outside (upper) corners of a trench in the silicon wafer is also carried out simultaneously with the deposition of oxide or nitride into the trench to thereby avoid formation of voids in the filler material. In the prior art, such faceting and deposition was carried out simultaneously in ECR/microwave frequency plasma CVD, while the prior art use of plasma-assisted CVD at high frequencies, such as the popular 13.56 MHz, resulted in the need for cycling the wafer between a deposition chamber and an etching chamber to achieve the desired faceting.

In accordance with the invention, simultaneous low pressure CVD deposition and faceting may be carried out using a plasma-assisted CVD process wherein the plasma is energized by a power source operating in a frequency range of about 50 MHz to 800 MHz, and preferably in a frequency range of from about 100 MHz up to about 250 MHz. Thus, the use of complicated microwave/ECR equipment, or need for cycling the wafer between deposition and etching chambers, may be avoided by the practice of the process of the invention.

The power density of the plasma during such a plasma-assisted CVD facet deposit should be maintained in a range of from about 10 to about 76 watts/in$^2$, preferably from about 30 to about 76 watts/in$^2$, and most preferably within a range of from about 45 to about 56 watts/in$^2$.

The deposition rate of either oxide or nitride will vary with the power density of the plasma with a power density range of 10 to 76 watts/in$^2$ resulting in a deposition rate ranging from about 0.1 to about 1.5 microns/minute, while operating in the power density range of from about 45 to about 56 watts/in$^2$ will result in a deposition rate ranging from about 0.4 to 1.0 microns/minute until the desired thickness of the material, e.g., oxide or nitride, has been deposited.

The pressure within the deposition chamber during such a plasma-assisted CVD facet deposition should be maintained within a range of from about 2 milliTorr up to about 500 milliTorr, preferably from about 20 milliTorr up to about 200 milliTorr.

The ratio of total effective area of the anode in the deposition chamber to the total effective area of the cathode (on which the wafer is supported), where "effective area", as previously defined, is the area coupled to the plasma, will range from a minimum of about 2:1 to about 20:1; while the spacing between the anode and the cathode will be at least about 5 cm. up to as much as 30 cm.

When depositing silicon oxide by this method, one or more sources of silicon and one or more sources of oxygen are flowed into the deposition chamber, as well as an optional inert gas such as Argon.

The source of silicon may be a gaseous source such as silane (SiH$_4$) or vapor from a liquid source such as an organic silicon source, e.g. tetraethylortho-silicate (TEOS). The source of oxygen may be O$_2$, N$_2$O, or a combination of same, either with or without a minor amount of O$_3$, or any other convenient source of oxygen. A dopant source may also be flowed into the reactor if it is desired to deposit a doped glass.

Typical flows of gas into a 5-10 liter deposition chamber, using silane as the source of silicon and O$_2$ or N$_2$O as the source of oxygen, with an Argon gas, would be about 10-150 sccm of SiH$_4$, about 10-300 O$_2$ or N$_2$O, and from 0 to about 500 sccm Argon. If TEOS is used as the source of silicon, typical flows range from about 0.1 to about 1.0 grams/minute.

Silicon nitride may be deposited on the semiconductor wafer instead of silicon oxide under the same deposition conditions by substituting a source of nitrogen for the source of oxygen, while using any of the above noted sources of silicon that do not form an oxynitride. It should be noted, in this regard, that the so-called silicon nitride formed may not be a true Si$_3$N$_4$ compound, but rather a Si$_x$H$_y$N$_2$ compound which is, however, customarily referred to as silicon nitride, or simply "nitride".

When depositing such a silicon nitride layer, nitrogen and ammonia may be used as sources of nitrogen. An optional source of hydrogen may also be supplied. Typical gas flows for deposition of silicon nitride, under the same conditions as for the deposition of silicon oxide, would be about 10 to about 150 sccm SiH$_4$, about 25 to about 300 sccm N$_2$, about 0 to about 50 sccm NH$_3$, 0 to about 50 sccm hydrogen, and 0 to about 500 sccm Argon.

If it is desired to deposit silicon oxynitride on a semiconductor wafer, a source of oxygen may be additionally supplied to the reactants used in forming silicon nitride, without substantially changing any other reaction conditions.

D. HIGH PRESSURE CVD (CONFORMAL ISOTROPIC) DEPOSITION

Deposition of an isotropic conformal layer of materials such as silicon oxide and silicon nitride may also be made in accordance with the invention under high pressure conditions, i.e., at pressures exceeding 500 milliTorr up to as high as 50 Torr or higher, but preferably ranging from about 1 Torr to about 20 Torr, using a plasma powered by a power source at a frequency within the range of about 50 MHz up to about 800 MHz, preferably from about 150 MHz to about 800 MHz, and maintained at a power density of from about 10 to about 38 watts/in$^2$ of wafer area, e.g., at a power level of about 200 to about 750 watts for a typical 5" diameter wafer. The anode to cathode spacing between electrodes ranging from about 0.2 cm up to about 5 cm.

The silicon source may be a gaseous source such as silane (SiH$_4$) or a substituted silane such as, for example, SiH$_2$Cl$_2$. The source of oxygen may be N$_2$O or any other convenient and reasonably safe source of oxygen.

Typical flows of gas into a 5-10 liter deposition chamber, using silane as the source of silicon and N$_2$O as the source of oxygen, would be about 10-100 sccm of SiH$_4$ and about 100-5000 N$_2$O. Under such deposition conditions, a deposition rate of about 0.1 to about 2 microns/minute can be maintained until the desired thickness of conformal SiO$_2$ is achieved.

Silicon nitride may also be deposited instead of silicon oxide under the same high pressure deposition conditions by substituting a source of nitrogen for the source of oxygen. As in the low pressure process, nitrogen and (optionally) ammonia may be used as sources of nitrogen. Typical gas flows for deposition of silicon nitride, under the same conditions as for the high pressure deposition of silicon oxide, would be about 10 to about 100 sccm SiH$_4$, about 100 to about 10,000 sccm N$_2$, and about 0 to about 100 sccm NH$_3$ to achieve about the same deposition rate as for silicon oxide, i.e., from about 0.1 to about 2 microns/minute.

If it is desired to isotropically deposit a conformal layer of silicon oxynitride on a semiconductor wafer, a source of oxygen such as 0 may be additionally supplied to the reactants used in forming silicon nitride, without substantially changing any other reaction conditions.

Thus, the invention provides an improved process for the etching and deposition of materials on a semiconductor wafer using a plasma energized by a power source operated at a frequency within a range of from about 50 MHz to about 800 MHz to provide a sheath voltage low enough to avoid risk of damage to devices on the wafer, yet high enough to achieve desired anisotropy, while permitting the process to be carried out at reaction rates comparable to prior art processes.

Having thus described the invention what is claimed is:

1. A low pressure plasma-assisted RIE process for anisotropically etching silicon oxide in the fabrication of integrated circuit devices on semiconductor wafers characterized by the generation, in a vacuum etching chamber, of a plasma using a power source having a frequency range of from about 100 MHz up to about 250 MHz to provide a sheath voltage low enough to avoid risk of damage to devices on said wafer during said etching and maintained at a power density level ranging from about 30 to about 76 watts/inch$^2$ of wafer area, while flowing one or more fluorine-containing gases and one or more carbon-containing gases into said vacuum etching chamber containing an anode and a wafer mounted on a cathode and maintained at a pressure within a range of from about 2 to about 500 milliTorr to provide a silicon oxide etch rate of from about 0.3 to 0.75 microns/minute.

2. The process of claim 1 wherein said anode and cathode electrodes have a ratio of anode to cathode area of at least about 2:1 and an electrode spacing of about 5 cm. or more.

3. The process of claim 1 wherein said anode and cathode electrodes have an electrode spacing ranging from about 5 cm. to about 30 cm.

4. The process of claim 1 wherein said power source is operated within a frequency range of from about 150 MHz to about 200 MHz.

5. The process of claim 2 wherein said pressure in said chamber ranges from about 20 to about 200 milliTorr.

6. The process of claim 2 wherein said power density ranges from about 45 to about 56 watts/in$^2$ of wafer area.

7. The process of claim 2 which further comprises flowing an optional source of hydrogen and an optional inert gas through said chamber while said plasa is ignited therein.

8. The process of claim 7 wherein said RIE process comprises a selective process for etching silicon oxide in preference to polysilicon or photoresist wherein the atomic ratio of carbon to fluorine ranges from about 0.1:1 to about 2:1 and the atomic ratio of hydrogen present to fluorine ranges from about 0.1:1 to 0.5:1 to obtain a ratio of silicon oxide etch (thickness) rate to polysilicon or photoresist etch (thickness) rate of from about 2:1 to over 30:1.

9. A plasma-assisted high pressure process for etching silicon oxide in the fabrication of integrated circuit devices on semiconductorb wafers characterized by the generation, in a vacuum etching chamber, of a plasma using one or more power sources having a frequency range of from about 100 MHz up to about 200 MHz to provide a sheath voltage low enough to avoid risk of damage to devices on said wafer during said etching and maintained at a power density level ranging from about 30 to about 50 watts/inch$^2$ of wafer area, while flowing one or more fluorine-containing gases and one or more carbon-containing gases into said vacuum etching chamber containing an anode and a wafer mounted on a cathode spaced from said anode a distance ranging from about 0.2 to less than about 5 cm., said vacuum chamber maintained at a pressure within a range of over 500 milliTorr to about 50 Torr to provide a silicon oxide removal rate of about 0.2 to about 1 micron/minute.

10. The process of claim 9 wherein said high pressure plasma etching process is operated within a pressure range of from about 1 Torr to about 20 Torr.

11. The process of claim 6 which further comprises flowing an optional source of hydrogen and an optional inert gas through said chamber during said etch.

12. The process of claim 11 wherein said high pressure plasma silicon oxide etch process comprises a selective process for etching silicon oxide in preference to polysilicon or photoresist wherein the atomic ratio of carbon to fluorine ranges from about 0.1:1 to about 2:1 and the atomic ratio of hydrogen present to fluorine ranges from about 0.1:1 to 0.5:1 to obtain a ratio of silicone oxide etch (thickness) rate to polysilicon or photoresist etch (thickness) rate of from about 2:1 to over 30:1.

13. A plasma-assisted low pressure CVD process for depositing materials selected from the group consisting of silicon oxide and silicon nitride used in the fabrication of integrated circuit devices on semiconductor wafers characterized by the generation, in a vacuum deposition chamber of a plasma using one or more power sources having a frequency range of from about 100 MHz up to about 250 MHz to provide a sheath voltage low enough to avoid risk of damage to devices on said wafer during said deposition process and maintained at a power density level ranging from about 30 to about 76 watts/inch$^2$ of wafer area in a vacuum deposition chamber containing an anode and a wafer mounted on a cathode spaced from said anode a distance of from about 5 to about 30 cm., said vacuum chamber maintained at a pressure within a range of from about 2 to about 500 milliTorr to provide a deposition rate of from about 0.1 to about 1.5 microns/minute.

14. The process of claim 13 wherein said pressure in said chamber ranges from about 20 to about 200 milliTorr.

15. The process of claim 14 wherein said power density ranges from about 45 to about 56 watts/in$^2$ of wafer area.

16. The process of claim 15 which further comprises flowing one or more sources of silicon, one or more sources of oxygen, and an optional inert gas through said chamber while said plasme is ignited therein.

17. The process of claim 13 which further comprises flowing one or more sources of silicon, one or more sources of nitrogen, an optional source of hydrogen, and an optional inert gas through said chamber while said plasma is ignited there.

18. A plasma-assisted high pressure CVD conformal isotropic process for depositing materials selected from the group consisting of silicon oxide and silicon nitride used in the fabrication of integrated circuit devices on semiconductor wafers characterized by the generation, in a vacuum deposition chamber of a plasma using one or more power sources having a frequency range of from about 150 MHz up to about 800 MHz to provide a sheath voltage low enough to avoid risk of damage to devices on said wafer during said deposition process and maintained at a power density level ranging from about 10 to about 38 watts/inch$^2$ of wafer area in a vacuum etching chamber containing an anode and a wafer mounted on a cathode spaced from said anode a distance of from about 0.2 to about 5 cm., said vacuum chamber maintained at a pressure within a range of over 500 milliTorr to about 50 Torr to provide a deposition rate of from about 0.5 to about 1.0 microns/minute.

19. The process of claim 18 which further comprises maintaining a pressure in said chamber ranging from about 1 Torr to about 20 Torr.

20. The process of claim 9 wherein said process further comprises flowing one or more sources of silicon, one or more sources of oxygen, and an optional inert gas through the chamber.

21. The process of claim 19 wherein said process further comprises flowing one or more sources of silicon, one or more sources of nitrogen, an optional source of hydrogen, and an optional inert gas through the chamber.

22. A low pressure plasma-assisted RIE process for anisotropically etching a material selected from the group consisting of aluminum and polysilicon in the fabrication of integrated circuit devices on semiconductor wafers characterized by the generation, in a vacuum etching chamber, of a plasma using a power source having a frequency range of from about 150 MHz up to about 600 MHz to provide a sheath voltage low enough to avoid risk of damage to devices on said wafer during said etching and maintained at a power density level ranging from about 20 to about 40 watts/inch$^2$ of wafer area, while flowing a mixture of one or more chlorine-containing gases and one or more inert gases into said vacuum etching chamber containing an anode and a wafer mounted on a cathode and maintained at a pressure within a range of from about 2 to about 500 milli-Torr to provide an aluminum or polysilicon etch rate of froma bout 0.2 to about 1 microns per minute.

23. The process of claim 22 wherein said pressure in said chamber ranges from about 20 to about 200 milliTorr.

24. The process of claim 23 wherein said anode and cathode electrodes have a ratio of anode to cathode area of from about 2:1 to about 20:1 and an anode to cathode spacing of from about 5 to about 30 cm.

25. A plasma-assisted high pressure process for etching a material selected from the group consisting of aluminum and polysilicon in the fabrication of integrated circuit devices on semiconductor wafers characterized by the generation, in a vacuum etching chamber, of a plasma using one or more power sources having a frequency range of from about 100 MHz up to about 200 MHz to provide a sheath voltage low enough to avoid risk of damage to devices on said wafer during said etching and maintained at a power density level ranging from about 20 to about 40 watts/inch$^2$ of wafer area, while flowing one or more chlorine-containing gases and one or more inert gases into said vacuum etching chamber containing an anode and a wafer mounted on a cathode psaced from said anode a distance ranging from about 0.2 to less than about 5 cm., said vacuum chamber maintained at a pressure within a range of over 500 milliTorr to about 50 Torr to provide an aluminum or polysilicon removal rate of about 0.2 to about 1 micron/minute.

26. The process of claim 25 wherein said high pressure plasma etching process is operated within a pressure range of from about 1 Torr to about 20 Torr.

* * * * *